United States Patent [19]

Winter et al.

[11] Patent Number: 5,425,966
[45] Date of Patent: Jun. 20, 1995

[54] PROCESS FOR COATING WITH SINGLE SOURCE PRECURSORS

[75] Inventors: Charles H. Winter, Grosse Pointe Park; T. Suren Lewkebandara, Farminton, both of Mich.

[73] Assignee: Wayne State University, Detroit, Mich.

[21] Appl. No.: 329,841

[22] Filed: Oct. 27, 1994

[51] Int. Cl.$^6$ ............................................. C23C 16/00
[52] U.S. Cl. .................................. 427/255.1; 427/294; 427/248.1
[58] Field of Search .................. 427/294, 248.1, 255.1

Primary Examiner—Bernard Pianalto
Attorney, Agent, or Firm—Brooks & Kushman

[57] ABSTRACT

Reaction products of metal halides with organic chalcogenides and dichalcogenides provide single source precursors for metal dichalcogenide coatings. The single source precursors are sublimed at reduced pressure and allowed to contact a substrate maintained at an elevated temperature. The resulting dichalcogenide coatings are smooth, and adherent, and may be utilized in numerous applications, for example, as cathodes for lithium batteries.

13 Claims, 1 Drawing Sheet

PROCESS FOR COATING WITH SINGLE SOURCE PRECURSORS

This invention was made with Government support, under Contract No. CHE 91 23339, awarded by the National Science Foundation. The Government has certain rights in the invention.

TECHNICAL FIELD

The present invention relates to the deposition of metal chalcogenide coatings onto a substrate through the use of chemical vapor deposition techniques. More particularly, the present invention relates to the deposition of metal dichalcogenide coatings through the use of a single source precursor.

BACKGROUND ART

In recent years, thin coatings of certain species of metal chalcogenides, such as titanium sulfide ($TiS_2$) and other transition metal sulfide materials have been intensively investigated. Such coatings are useful, for example, in lithium battery electrodes and solar control panels. Coatings of $TiS_2$ may be formed using chemical vapor deposition (CVD) methods, by sulfurization of titanium metal at elevated temperatures, and by sputtering methods.

In order to prepare $TiS_2$ thin coatings by plasma chemical vapor deposition methods (PCVD), a titanium source, such as titanium tetrachloride ($TiCl_4$) or Ti metal, is reacted with hydrogen sulfide ($H_2S$) in a plasma between 300° and 450° C. This results in either powder formation or deposition of thin coatings, depending on the conditions. As exemplified by Kikkawa et al (APPL. PHYS. A 1989, 49, 105) gaseous $TiCl_4$ and $H_2S$ were reacted for 10–60 minutes in a low pressure glow discharge at temperatures below 450° C. to yield a thin coating of $TiS_2$. However, such techniques require that relatively cumbersome, expensive apparatus be used to generate the exacting low pressure experimental conditions.

In order to fabricate $TiS_2$ coatings by low pressure chemical vapor deposition (LPCVD), gaseous $TiCl_4$ is reacted with $H_2S$ in a nitrogen or argon stream at low pressures ($\leq 30$ torr). Representative of LPCVD techniques is Kanehori et al. (J. ELECTROCHEM. SOC 1989, 136, 1265), in which $TiCl_4$ and $H_2S$ were reacted in the gas phase at 510° C. to produce stoichiometric coatings of $TiS_2$. However, a major drawback of such techniques is that the deposition rates are quite slow. For example, deposition rates may vary between 3 and 9 microns per hour, depending upon the carrier gas flow rate.

A study of the formation of $TiS_2$ coatings by atmospheric pressure chemical vapor deposition (APCVD) was reported by Motojima et al (BULL. CHEM. SOC. JPN. 1978, 51, 3240), in which a gaseous mixture of $TiCl_4$ and $H_2S$ in argon yielded $TiS_2$ thin coatings at temperatures between 400° and 850° C. However, the crystallinity, stoichiometry and resultant coating density varied markedly with temperature and flow rate. As a result, this technique makes it difficult to reproduce thin coatings of given characteristics with any reliability.

In such prior art methods, various problems are encountered. Relatively complex equipment and instrumentation are required to prepare the coatings. Additionally, use of a toxic and extremely odiferous gas, such as $H_2S$, is necessary. Also, the $TiS_2$ coating stoichiometry can vary significantly from the desired titanium to sulfur ratio of 1:2. Further, the coating deposition rates of the prior art methods tend to be quite slow, especially where thin coatings of high quality are desired. Moreover, the density of the resultant $TiS_2$ coatings is likely to be less than that of bulk $TiS_2$. This may consequently lead to inferior electrical, optical and diffusion properties.

U.S. Pat. No. 5,112,650, which is herein incorporated by reference, discloses preparation of metal chalogenide coatings by employing separate reactant streams of vaporous metal halide and a source of vaporous chalcogen, preferably an organic thiol. This process results in rapid deposition, but requires monitoring of two separate reactant streams as well as thorough mixing of the streams prior to contact with the substrate.

The preparation of titanium disulfide coatings from a single source precursor prepared by the reaction of titanium tetrachloride with two equivalents of an alkanethiol is reported by Winter et al in INORGANIC CHEMISTRY (1993), pages 3807–3808, and is also the subject of U.S. Pat. No. 5,298,295, which is herein incorporated by reference. However, the use of alkanethiols other than cyclic alkanethiols resulted in complexes of exceptionally high volatility, which made their manipulation and characterization difficult. Moreover, some of the complexes were unstable to the extent that in certain solvents they reacted to form polymeric compounds having the empirical formula $TiCl_2S$.

SUMMARY OF THE INVENTION

It is therefore an object of the invention to provide a chemical vapor deposition method for depositing thin coatings of metal chalcogenides in which the use of reasonable pressures greatly simplifies the equipment and instrumentation required to prepare the coatings.

A further object of the invention is to provide a process that produces coatings at high deposition rates.

Additionally, it is an object of the invention to employ a less toxic and less volatile source of chalcogens than are manifest in prior art approaches.

Further, it is an object of the invention to produce stoichiometric coatings of highly dense metal chalcogenides, thereby maximizing electrical, optical and diffusion properties.

A still further object of the invention is to produce stoichiometric coatings of metal dichalcogenides without resort to the use of separate reactant streams.

In satisfying the above-mentioned objects of the invention, a single source metal chalcogenide precursor is provided which can be sublimed under vacuum and which forms a metal dichalcogenide coating onto a substrate located in a chemical vapor deposition reactor.

BRIEF DESCRIPTION OF THE DRAWINGS

The FIGURE is a schematic view of apparatus used to practice the disclosed method for producing substrates coated with a thin coating of metal chalcogenide according to the present invention.

BEST MODE FOR CARRYING OUT THE INVENTION

Figure 1:
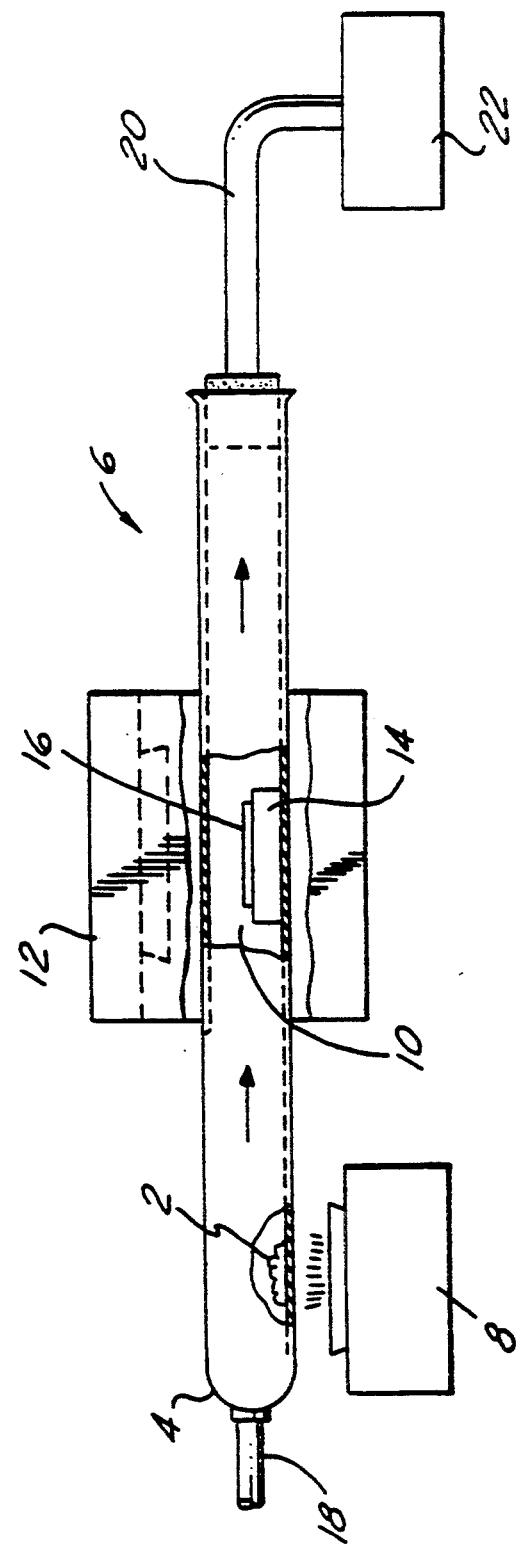

A metal chalcogenide coating to be formed on a substrate may be crystalline or amorphous. However, a crystalline coating is preferable to an amorphous coating since the optical, electronic, and diffusion properties are more uniform. Also, many technological applications require crystalline materials for optimum performance. Accordingly, the invention disclosed herein is directed to the process for preparing thin metal chalcogenide coatings formed on a substrate, such coatings being crystalline in nature.

In the process of the invention, a single source metal dichalcogenide precursor is placed in a vacuum chamber and sublimed slowly, the vapors being allowed to contact a substrate heated to an elevated temperature in a chemical vapor deposition apparatus. As a result, a thin, highly adherent coating of metal dichalcogenide is rapidly deposited. As a direct result of utilizing a single source precursor for the deposition of a metal dichalcogenide coating, the use of separate reactant streams which require tight control of their relative proportions is avoided, and yet the metal dichalcogenide coating can be deposited without resort to more expensive techniques, such as sputtering, plasma, or laser ablation. Moreover, the pressure utilized is a low to moderate vacuum, for example 0.001 to 0.01 mmHg at the lower limit. By contrast, many previously disclosed methods require a much higher vacuum, in the range of $10^{-4}$–$10^{-7}$ mmHg. While the single source precursors of the subject invention could be used at such high vacuum conditions, a low to moderate vacuum is sufficient.

The substrate to be coated with the metal dichalcogenide coating is not critical, and may be any substrate which is capable of withstanding the temperatures necessary for the decomposition of the single source precursor. As the required temperature for decomposition lies in the range of 200° C. to 1000° C., substrates which melt, decompose, or deform at the selected temperature are generally not suitable for use in the process of the invention. Suitable substrates are for example, metals such as tool steel, stainless steel, aluminum and its alloys, and in general, most metals having stability at the temperature ranges necessary to decompose the single source precursor. Also suitable are substrates of glass, for example, borosilicate glass, quartz glass, and VYCOR ™, as well as ceramic materials. Also suitable are temperature resistant polymers, for example polyaramides, polysulfones and polyethersulfones, polyetherketones, polyimides, and the like, as well as amorphous or single crystal semiconductors, for example, silicon, gallium arsenide, and the like. Substrates such as the above which have been previously coated with ether inorganic films, such as metal nitrides or chalcogenides are also suitable, thus producing a multi-layer coated product.

With any particular single source precursor, three operating parameters are of primary importance. These are: the sublimation temperature of the single source precursor, the pressure of the chemical vapor deposition apparatus, and the substrate temperature.

The sublimation temperature is selected so as to provide a slow but even flow of the sublimed single source precursor to the chemical vapor deposition reaction chamber. The particular temperature selected will depend on a number of factors, including the rate of sublimation of the single source precursor at the particular pressure utilized in the apparatus, the temperature of the substrate on which the coating is to be deposited, and the rate at which the coating is desired to be deposited. Increasing the sublimation temperature will, in general, increase the rate of deposition. However, if the flow of sublimed material exceeds the rate at which deposition can be maintained, loss of the expensive single source precursor will result. Furthermore, a sublimation temperature which is excessive may result in the decomposition of the single source precursor material at its source rather than on or near the substrate to be coated.

The pressure in the apparatus may be adjusted to achieve a desired sublimation temperature and flow rate. Too low a pressure will result in an excessive rate of sublimation of the single source precursor, whereas higher pressures may result in an uneven deposition of coating, or a sublimation temperature which is too high. The pressures utilized are generally below atmospheric, preferably in the range of 0.001 torr to 100 torr, more preferably in the range of 0.01 to 10 torr and most preferably within the range of 0.01 to 1 torr. At such pressures, the sublimation temperature ranges from $-10°$ C. to 200° C., more preferably within the range of 40° C. to 150° C., and most preferably within the range of 60° to 120° C.

The temperature of the substrate will be maintained at a temperature higher than the sublimation temperature of the single source precursor. Suitable temperatures are in the range of 200° C. to 1000° C., preferably within the range of 300° C. to 700° C., and more preferably within the range of 400° C. to 600° C. In general, higher substrate temperatures lead to higher decomposition rates of the single source precursor, but result in lowered deposition rates of metal dichalcogenide coating. For example, although the decomposition rate of the single source precursor will be higher at 600° C. than 500° C., coating deposition rate will often be higher at the lower temperature. Thus, a compromise between decomposition rate and deposition rate must be selected in some cases.

It has further been observed that the temperature of the substrate may affect the crystalline orientation of the coating to be deposited. For example, with titanium disulfide films, a 110 crystalline orientation is preferred, with the crystallographic axes oriented perpendicular to the plane of the substrate.

The single source metal chalcogenide precursors useful in the present invention are the reaction products of the halide of a metal capable of forming a metal dichalcogenide and an organic sulfide or disulfide. The single source precursors may be readily prepared through reaction of the metal chloride with the organic chalcogenide or chalcogenide. The products are easily isolatable solids which sublime at temperatures and pressures suitable for use in chemical vapor deposition processes. Preferably, the single source precursors are prepared by reacting 1 mol of metal halide with 1 mol of an organic dichalcogenide or 2 mols of an organic chalcogenide. Without wishing to be bound by any particular theory or structure, the preferred products are believed to be somewhat distorted octahedral mono- or poly-nuclear complexes having the formulae:

$MX_4(TR^1R^2)_2$,

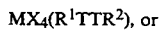

$MX_4(R^1TTR^2)$, or

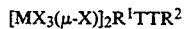

$[MX_3(\mu\text{-}X)]_2R^1TTR^2$ wherein M is the metal; X is a halogen; $\mu$-X is a halogen bridging two metals; $R^1$ and $R^2$ may be the same or different and represent organic radicals or together represent a cyclic diradical; and T represents a chalcogen. By chalcogen is meant sulfur, selenium, and tellurium or mixtures thereof. Polynuclear metal complexes containing three or more metal atom centers are also possible. The actual structure will depend on such factors as the size of the metal, the size of the chalcogen species, the chalcogen-chalcogen bond length of the organic dichalcogenides and the steric requirements of $R^1$ and $R^2$.

The metal, M, is any metal capable of forming a stable metal dichalcogenide. Suitable metals include, but are not limited to, titanium, zirconium, and hafnium, which are preferred.

Suitable organic chalcogenides and dichalcogenides correspond to the formula $R^1TR^2$ and $R^1TTR^2$, respectively. In these formulae, T represents a chalcogen, for example, sulfur, selenium, or tellurium. $R^1$ and $R^2$ may be the same or different and represent an organic radical or in combination, a cyclic organic diradical. While the organic radicals are preferred to be carbon-containing radicals, it is within the scope of the invention to further utilize radicals of other group IV elements, such as germanium, silicon, and tin. Examples of the latter are, for example, the trimethylgermanyl, trimethylsilyl, and trimethylstannyl radicals, as well as other alkyl-, cycloalkyl-, or alkenyl- substituted germanyl, silyl, or stannyl radicals. Preferably, however, the organic radicals are carbon-containing radicals. The carbon-containing radicals may be alkyl, alkenyl, cycloalkyl, cycloalkenyl, or aryl radicals.

Suitable alkyl radicals are $C_{1-8}$, preferably $C_{1-8}$, and most preferably $C_{1-4}$ linear or branched alkyl groups. Examples are methyl, ethyl, propyl, i-butyl, t-butyl, pentyl, hexyl, 2-ethylhexyl, octyl, decyl, dodecyl, and the like. Suitable alkenyl groups are, for example, $C_{2-8}$, preferably $C_{2-8}$, and more preferably $C_{2-6}$ branched and unbranched alkenyl groups, for example, ethenyl, propenyl, allyl, butenyl, hexenyl, and the like. Suitable cycloalkyl groups are $C_{3-8}$, preferably $C_{3-6}$, and more preferably $C_{5-6}$ cycloalkyl groups. Examples of suitable cycloalkyl groups are cyclopropyl, cyclobutyl, cyclopentyl, methylcyclopentyl, cyclohexyl, methylcyclohexyl, dimethylcyclohexyl, cyclooctyl, and the like. Suitable cycloalkenyl groups are $C_{3-8}$, preferably $C_{4-6}$, and more preferably $C_{5-6}$ cycloalkenyl groups. Examples of suitable cycloalkenyl groups are cyclopropenyl, cyclobutenyl, cyclopentenyl, cyclohexenyl, cyclooctenyl, and cyclooctadienyl. The various alkyl, alkenyl, cycloalkyl, and cycloalkenyl, groups may be unsubstituted, or may be substituted by any substituent which does not interfere with the formation of the single source precursor complexes. Particularly preferred substituents are $C_{1-4}$ alkyl groups, preferably methyl groups, halo, and substituted alkyl groups, such as trifluoromethyl. Suitable aryl groups are the mononuclear and polynuclear or fused aryl groups containing from 6 to 14 carbon atoms, preferably substituted and unsubstituted phenyl, naphthyl, anthracenyl, biphenyl, and the like. The aryl groups may contain hetero atoms in the aryl rings provided that the hetero atoms do not interfere with formation of the single source precursor, and may further be substituted by noninterfering groups, such as methyl, halo, ethyl, trifluoromethyl, and the like.

$R^1$ and $R^2$ may together form a cyclic diradical, in which case the sulfide or disulfide will be a cyclic sulfide or cyclic disulfide. In such cases, $R^1$ and $R^2$ together will preferably contain from 3 to 5 carbon atoms, preferably from 4 to 5 carbon atoms. Particularly suitable are, for example, tetrahydrothiophene, pentamethylene sulfide, tetramethylene disulfide, and the like. The organic chalcogenides and dichalcogenides can be prepared by methods well-known to those skilled in the art.

The single source precursors are prepared by reacting the appropriate anhydrous metal halide with the organic chalcogenide or chalcogenide in an organic solvent, generally in the presence of an inert atmosphere, for example, a nitrogen or argon blanket. Aprotic inert solvents are generally preferred. Examples are hexane, and dichloromethane. Hexane is most preferred. In general, the metal halide is added to the solvent in a flask fitted with a stir bar and rubber septum following which the particular organic sulfide or disulfide is injected via a syringe. The initial reaction temperature is generally relatively low, for example, 0° C., and is generally maintained at that temperature with stirring for a period of from 20 minutes to 4 hours. Following this initial period, the reaction temperature is raised to room temperature and stirring is continued until the reaction is complete. The reaction progress can be monitored by any number of methods, including visual observation, as well as by analysis of aliquots to determine unreacted starting materials. At the conclusion of the reaction, volatiles are removed in vacuo to afford the single source precursor as a solid material.

An example of a suitable apparatus which may be utilized to coat substrates with metal dichalcogenide coatings using the single source precursors of the present invention is illustrated in FIG. 1. The single source precursor 2 is located in the closed end 4 of sealed quartz tube 6. Quartz is generally utilized, as glass tubes may have insufficient strength at higher temperatures. In the case of compounds which are able to be deposited at lower temperatures, glass tubes or tubes of other materials may suffice. Using heat source 8, single source precursor 2 is sublimed. Heat source 8 is suitable to provide a temperature of, for example, from 25° to 150° C. at a pressure selected from a range of about 0.001 to 760 mm Hg. Preferably, heat source 8 will supply a temperature of between 60° and 120° C., at a pressure in the range of preferably from 0.01 to 1.0 mm Hg.

The sublimate from single source precursor 2 travels through tube 6 to the reaction zone 10. The reaction zone 10 is comprised of that section of the tube 6 arrayed within a furnace 12 which has sufficient heat capacity to increase the temperature of reaction zone 10 to a temperature selected from the range of about 200° to about 1000° C. Preferably, the reaction zone will be heated to a temperature selected from a range of about 300° to 700° C., more preferably from 400° to 600° C. Disposed within reaction zone 10 of the quartz tube 6 is a ceramic stage 14 upon which the desired substrate 16 has been placed. In an alternative embodiment, rather than enclose the entire tube 6 in a furnace, the ceramic stage 14 may itself be heated, as in a cold walled reactor.

Substrate 16 may be comprised of glass, steel, silicon, or any other substrate desired to be coated. Steel may be defined as an iron-containing alloy. Low sodium glass is particularly suitable, as is stainless steel. An example of a suitable glass is Corning 7059. Preferably, however, the substrate will be of silicon or other semiconductor materials, for example gallium arsenide and most preferably will be individual sheets of monocrystalline silicon. Suitable silicon may be obtained from numerous sources, for example from Matheson Scientific of Detroit, Mich. Typical substrates are normally in the range of size from 2 centimeters to about 5 centimeters, although much larger substrates are possible, the size dependent only upon the size of the CVD apparatus.

Upon the passing over of sublimed source 2, substrate 16 is coated with a thin coating of metal dichalcogenide. If desired, a stream of inert gas such as argon may be introduced at port 18 to assist in the flow of sublimed source 2 through the tube 6. After exiting reaction zone 10, sublimed source 2 exits quartz tube 6 to leave the system through vacuum pump 22, along with any reaction by-products.

The following examples are provided to illustrate the invention, and are not intended to be limiting in any way. Numerous modifications and adaptations will readily suggest themselves to one of ordinary skill in the art.

EXAMPLE 1

Preparation of [TiCl$_4$(Ph$_2$Te$_2$)]. A 250-mL Schlenk flask was charged with diphenyiditelluride (2.0 g, 4.89 mmol), hexane (45 mL), a stir bar, and was fitted with a rubber septum. The contents of the flask were cooled to 0° C. and titanium tetrachloride (0.54 mL, 4.89 mmol) was added via a syringe to afford a red turbid solution. The solution was allowed to warm up to ambient temperature and was stirred for 2.0 h. The volatiles were pumped off to afford a red-black solid; mp 168° C. (dec); IR (Nujol, cm-1) 1457 (s), 1366 (m), 1258 (m), 116 (w), 1101 (m), 1096 (m), 1087 (m), 1075 (m), 1065 (m), 1058 (m), 1042 (m), 1030 (m), 1014 (s), 966 (w), 863 (w), 816 (m), 802 (m), 797 (s), 691 (w), 670 (w).

EXAMPLE 2

Preparation of [TiCl$_4$(Me$_2$Se)$_2$]. A 150-mL Schlenk flask was charged with titanium tetrachloride (5.00 mL, 45.8 mmol), hexane (50 mL), a stir bar, and was fitted with a rubber septum. This solution was cooled to 0° C. and dimethylselenide (10.0 g, 91.5 mmol) was added via syringe. A brick red complex was formed and the solution was stirred for 1.5 h. The volatiles were pumped off to afford [TiCl$_4$(Me$_2$Se)$_2$] as a brick red solid (17.9 g, 96% based on titanium tetrachloride). Deep red crystals were obtained by sublimation of the crude powder at 40° C. (0.05 mmHg): mp 95°-96° C. (dec. with sublimation); IR (Nujol, cm$^{-1}$) 3023 (w), 3010 (w), 1412 (s), 1360 (m), 1280 (m), 1261 (m), 1162 (w), 1091 (w), 1015 (w), 963 (m), 921 (s), 911 (s), 878 (w), 793 (w), 718 (w); $^1$H NMR (CDCl$_3$, 23° C., δ) 2.48 (s, CH$_3$); $^{13}$C{$^1$H} NMR (CDCl$_3$, 23° C., ppm) 17.68 (s, CH$_3$); $^{77}$Se NMR (CD$_2$Cl$_2$, 23° C., ppm) 186.59 (s), 186.53 (s), 186.11 (s).

Analysis calculated for C$_4$H$_{12}$Cl$_4$Se$_2$Ti: C, 11.78; H, 2.97. Found: C, 11.42; H, 2.93.

EXAMPLE 3

Preparation of [(TiCl$_3$(μ-Cl))$_2$(MeSSMe)]. A 250-mL Schlenk flask was charged with titanium tetrachloride (3.0 ml, 27.4 mmol), hexane (60mL), a stir bar, and was fitted with a rubber septum. The contents were cooled to 0° C. and dimethyldisulfide (4.93 mL, 54.7 mmol) was added via a syringe to afford an orange solution. This solution was stirred for 1.5 h, and the volatiles were pumped off to afford [(TiCl$_3$(μ-Cl))$_2$(MeSSMe)] as a yellow-brown solid (6.34 g, 98% based on titanium tetrachloride): mp 63°-64° C. (dec. with sublimation); IR (Nujol, cm$^{-1}$) 1605 (w), 1446 (s), 1408 (w), 1365 (w), 1257 (w), 1084 (w), 1075 (w), 1058 (w), 1022 (w), 799 (m); $^1$H NMR (CDCl$_3$, 23° C., δ) 2.56 (s,CH$_3$); $^{13}$C{$^1$H} NMR (CDCl$_3$ 23° C., ppm) 23.20 (s, CH$_3$).

Analysis calculated for C$_2$H$_6$Cl$_8$S$_2$Ti: C, 5.07; H, 1.28. Found: C, 5.12; H, 1.27.

EXAMPLE 4

Preparation of [TiCl$_4$(SC$_4$H$_8$)$_2$]. A 100-mL Schlenk flask Was charged with titanium tetrachloride (0.10 mL, 0.91 mmol), dichloromethane (30 mL), a stir bar and was fitted with a rubber septum. The contents were cooled to 0° C. and tetrahydrothiophene (0.16 mL, 1.82 mmol) was added via a syringe to afford an orange solution. This solution was stirred for 1.5 h. and the volatiles were pumped off to afford an orange solid (0.29 g, 87% based on titanium tetrachloride): mp 132° C. (with sublimation); IR (Nujol, cm$^{-1}$) 1438 (s), 1424 (m), 1405 (w), 1304 (m), 1252 (s), 1204 (w), 1128 (m), 1090 (broad, w), 1066 (m), 1013 (s), 955 (m), 879 (w), 869 (w), 798 (s), 659 (m); $^1$H NMR (CDCl$_3$, 23° C., δ) 3.35 (t, J=6.0 Hz, SCH$_2$), 2.13 (m, SCH$_2$CH$_2$); $^{13}$C{$^1$H} NMR (CDCl$_3$, 23° C., ppm) 39.90 (s, SCH$_2$), 29.81 (s, SCH$_2$CH$_2$).

Analysis calculated for C$_8$H$_{16}$Cl$_4$S$_2$Ti: C, 26.25; H, 4.41. Found: C, 24.95; H, 4.28.

EXAMPLE 5

Preparation of [TiCl$_4$(SC$_5$H$_{10}$)$_2$]. A 100-mL Schlenk flask was charged with titanium tetrachloride (0.10 mL, 0.91 mmol), hexane (15 mL), a stir bar, and was fitted with a rubber septum. The contents of the flask were cooled to 0° C. and pentamethylene sulfide (0.19 mL, 1.82 mmol) was added via syringe to give an orange solution. The resultant solution was stirred for 1.5 h. and the volatiles were pumped off to afford an orange solid (0.35 g, 97% based on titanium tetrachloride): mp 127° C. (with sublimation); IR (Nujol, cm$^{-1}$) 1453 (s), 1435 (s), 1420 (s), 1367 (w), 1352 (m), 1346 (m), 1336 (m), 1300 (m), 1266 (m), 1258 (m), 1231 (m), 1210 (m), 1202 (m), 1143 (w), 1095 (m), 1064 (m), 1013 (m), 966 (s), 961 (s), 894 (s), 838 (w), 828 (w), 813 (w), 739 (w), 719 (w), 678 (w), 645 (w), 636 (m); $^1$H NMR (CDCl$_3$, 23° C., δ) 3.11 (t, J=6.0 Hz, SCH$_2$), 1.92 (m, SCH$_2$CH$_2$), 1.62 (m, SCH$_2$CH$_2$CH$_2$). $^{13}$C{$^1$H} NMR (CDCl$_3$, 23° C., ppm) 37.97 (s, SCH$_2$), 27.02 (s, SCH$_2$CH$_2$), 25.42 (s, SCH$_2$CH$_2$CH$_2$).

Analysis calculated for C$_{10}$H$_{20}$Cl$_4$S$_2$Ti: C, 30.48; H, 5.12. Found: C, 30.41; H, 5.13.

EXAMPLE 6

Preparation of [TlCl$_4$(Me$_2$S)$_2$]. A 200-mL Schlenk flask was charged with titanium tetrachloride (3.0 mL, 27.4 mmol), hexane (45 mL), a stir bar and was fitted with a rubber septum. The contents of the flask were cooled to 0° C. and dimethylsulfide (4.02 mL, 54.7 mmol) was added via a syringe to afford a yellow-orange solution. The solution was stirred for 1.5 h. and the volatiles were pumped off to afford an orange solid (8.41 g, 98% based on titanium tetrachloride): mp 79°-82° C.; IR (Nujol, cm$^{-1}$) 1597 (w), 1426 (s), 1422 (s), 1411 (m), 1366 (w), 1325 (w), 1303 (w), 1258 (m), 1104 (w), 1095 (w), 1089 (w), 1066 (w), 1062 (w), 1028 (m), 1019 (m), 978 (w), 970 (w), 922 (w), 916 (w), 796 (m); $^1$H NMR (CDCl$_3$, 23° C., δ) 2.54 (s, CH$_3$); $^{13}$C{$^1$H} NMR (CDCl$_3$, 23° C., ppm) 25.00 (s, CH$_3$).

Analysis calculated for C$_4$H$_{12}$Cl$_4$S$_2$Ti: C, 15.30; H, 3.85. Found: C, 15.17; H, 3.75.

EXAMPLE 7

The single source precursor of Example 3 (1.00g, 2.1 mmol) was placed in a glass vial and placed at the sealed end of a 2.5 cm diameter quartz tube. Glass and silicon substrates were placed in the tube 10-20 cm from the glass vial containing the single source precursor. The portion of the tube containing the substrate was placed in a Lindberg tube furnace, while the portion of the tube containing the single source precursor was left outside the furnace, and wrapped with heat tape. The open end of the tube was connected to a vacuum system which maintained a pressure of c.a. 0.01 mmHg. When the substrate-containing portion of the tube reached the desired deposition temperature in the range of 300° C. to 600° C., the end of the tube containing the single source precursor was heated via the heat tape to a temperature in the range of 60° C. to 120° C., resulting in slow sublimation of the single source precursor over a period of from c.a. 5-10 minutes. After the precursor had completely sublimed, the tube was removed from the furnace and allowed to cool to room temperature under vacuum. The gold-colored substrates were then removed. Silicon and Corning 7059 low sodium glass substrates were used as received.

Examination of the titanium disulfide films by x-ray photoelectron spectroscopy revealed $TiS_2$ stoichiometry within the precision of measurement, and most importantly, revealed undetectable levels ($\leq 2\%$) of carbon and chlorine.

EXAMPLE 8

The procedure of Example 7 was utilized to prepare titanium diselenide films employing 1.00 g (2.45 mmol) of the single source precursor of Example 2, with substrate temperature in the range of 400° C. to 600° C. Smooth, silvery-purple colored films were obtained. X-ray photoelectron spectroscopy revealed $TiSe_2$ stoichiometry within the precision of measurement, and, as with Example 7, revealed undetectable levels of carbon and chlorine.

EXAMPLE 9

The procedure of Example 7 was utilized to prepare titanium ditelluride films employing 1.00 g (1.00 mmol) of the single source precursor of Example 1, with a substrate temperature in the range of 500° C. to 600° C. Dark metallic films were obtained under these conditions.

EXAMPLE 10

Using the procedure of Example 7 with a substrate temperature of 600° C., a titanium ditelluride film was prepared from $TiCl_4(Ph_2Te_2)$. The x-ray diffraction spectrum of the coating was consistent with the Joint Center for Powder Diffraction Spectra (JCPDS) files for $TiTe_2$.

EXAMPLE 11

The procedure of Example 7 was used to prepare titanium disulfide coatings from $TiCl_4$ (t-$Bu_2S_2$) as the single source precursor (t-Bu is tertiary-butyl 7). Substrate temperature was 510° C. The x-ray diffraction spectrum of the coating was consistent with the JCPDS files for $TiS_2$.

What is claimed is:

1. A process for coating a substrate with metal dichalcogenide by chemical vapor deposition from a single source precursor, comprising:
   a) selecting as said precursor the reaction product of the halide of a metal, M, capable of forming a metal dichalcogenide, and an organic chalcogenide or dichalcogenide or mixture thereof, wherein said organic chalcogenide has the formula $R^1TR^2$ and said organic dichalcogenide has the formula $R^1TTR^2$, wherein T is a chalcogen selected from the group consisting of sulfur, selenium, and tellurium and mixtures thereof, and wherein $R^1$ and $R^2$ may be the same or different, and are substituted or unsubstituted organic radicals selected from the group consisting of linear or branched $C_{1-18}$ alkyl, linear or branched $C_{2-18}$ alkenyl, $C_{3-8}$ cycloalkyl, $C_{3-8}$ cycloalkenyl, and $C_{6-14}$ aryl radicals, or wherein $R^1$ and $R^2$ together form a $C_{3-8}$ cyclic diradical, or wherein $R^1$ and $R^2$ are selected from organic germanyl radicals, silyl radicals, and stannyl radicals;
   b) subliming said precursor at a pressure of less than about 760 mm Hg; and
   c) contacting said sublimed precursor with a substrate maintained at a temperature sufficient to effect decomposition of said precursor to metal dichalcogenide, whereby a coating of metal dichalcogenide is formed on said substrate.

2. The process of claim 1 wherein said metal halide has the formula $MX_4$.

3. The process of claim 2 wherein said metal halide has the formula $MCl_4$.

4. The process of claim 1 wherein said metal halide is a metal chloride.

5. The process of claim 1 wherein said metal is selected from the group consisting of titanium, zirconium, and hafnium.

6. The process of claim 1, wherein said subliming takes place at a pressure of from 0.001 mm Hg to 1 mm Hg, and wherein said substrate is maintained at a temperature of from 300° C. to 700° C.

7. The process of claim 1 wherein said sublimed precursor is first contacted with an inert gas stream flowing in the direction of the substrate to be coated.

8. The process of claim 1 wherein $R^1$ and $R^2$ are selected from the group consisting of methyl, ethyl, propyl, butyl, t-butyl, and phenyl, and when $R^1$ and $R^2$ together form a cyclic diradical, said diradical is selected from the group consisting of trimethylene, tetramethylene, and pentamethylene.

9. The process of claim 1 wherein said precursor has an empirical formula selected from the group consisting of $MX_4(R^1TR^2)_2$;

$MX_4(R^1TTR^2)$; and $(MX_3(\mu-X))_2R^1TTR^2$.

10. The process of claim 9 wherein M is selected from the group consisting of titanium, zirconium, and hafnium and X is chlorine.

11. The process of claim 1 wherein said coating comprises a metal disulfide, and wherein said single source precursor comprises the reaction product of a titanium (IV) halide with an organic chalcogen compound selected from the group consisting of dimethyldisulfide, tetrahydrothiophene, pentamethylene sulfide, and dimethylsulfide.

12. The process of claim 1 wherein said coating comprises a metal diselenide and wherein said single source precursor comprises the reaction product of a titanium (IV) halide and dimethylselenide.

13. The process of claim 1 wherein said coating comprises a metal ditelluride and wherein said single source precursor comprises the reaction product of a titanium (IV) halide and diphenylditelluride.

* * * * *